(12) United States Patent
Kang et al.

(10) Patent No.: US 7,042,800 B2
(45) Date of Patent: May 9, 2006

(54) METHOD AND MEMORY SYSTEM IN WHICH OPERATING MODE IS SET USING ADDRESS SIGNAL

(75) Inventors: Young-gu Kang, Hanam-si (KR); Jong-hyun Choi, Suwon-si (KR); Woo-seop Jeong, Yongin-si (KR); Ki-ho Jang, Yongin-si (KR); Jung-yong Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 23 days.

(21) Appl. No.: 10/951,881

(22) Filed: Sep. 29, 2004

(65) Prior Publication Data
US 2005/0078548 A1    Apr. 14, 2005

(30) Foreign Application Priority Data
Oct. 9, 2003    (KR) .................... 10-2003-0070311

(51) Int. Cl.
*G11C 8/00* (2006.01)
(52) U.S. Cl. .................. 365/233; 365/230.06; 365/201
(58) Field of Classification Search ................ 365/233, 365/230.06, 201
See application file for complete search history.

(56) References Cited

U.S. PATENT DOCUMENTS

| | | | | |
|---|---|---|---|---|
| 5,426,606 A | * | 6/1995 | Takai ..................... | 365/189.05 |
| 5,598,376 A | * | 1/1997 | Merritt et al. ......... | 365/230.06 |
| 6,016,066 A | | 1/2000 | Ilkbahar | |
| 6,064,627 A | * | 5/2000 | Sakurai ..................... | 365/233 |
| 6,466,511 B1 | * | 10/2002 | Fujita et al. .............. | 365/233 |
| 2003/0009617 A1 | | 1/2003 | Cohen | |
| 2005/0005053 A1 | | 1/2005 | Jang | |

FOREIGN PATENT DOCUMENTS

| DE | 4408876 A1 | 9/1994 |
|---|---|---|
| JP | 7-282580 A | 10/1995 |
| KR | 1998-019814 | 6/1998 |
| KR | 2003-0039179 A | 5/2003 |

OTHER PUBLICATIONS 128M bits Self Terminated Interface DDR SDRAM, ELIPIDA, Nov. 2002, Document No. E0288E20 (Ver. 2.0), pp. 1-46.

* cited by examiner

*Primary Examiner*—Anh Phung
(74) *Attorney, Agent, or Firm*—Volentine Francos & Whitt pllc

(57) ABSTRACT

A memory system, memory device, and method for setting an operating mode of a memory device include a memory cell array; row and column decoders which select a row and a column of the memory cell array, respectively, according to a multi-bit address signal; and a mode control circuit which receives at least one bit from the multi-bit address signal used in the selection of the row or the column, and which sets an operating mode of the memory device according to the at least one bit, wherein the operating mode is one of a burst length mode, a DLL reset mode, a test mode, a CAS latency mode, and a burst type mode.

56 Claims, 12 Drawing Sheets

METHOD AND MEMORY SYSTEM IN WHICH OPERATING MODE IS SET USING ADDRESS SIGNAL

BACKGROUND OF THE INVENTION

1. Field of the Invention

This invention pertains to the field of memory systems, and more particularly, to a memory system and a method in which an operating mode is set using a multi-bit address signal.

A claim of priority is made under 35 U.S.C § 119 to Korean Patent Application No. 2003-70311, filed on 9 Oct. 2003, the entirety of which is hereby incorporated by reference.

2. Description of the Related Art

Certain memory systems are generally capable of operating under a variety of different operating modes, such as different data strobe modes, different data burst lengths, different CAS latencies, and so on. Accordingly, the memory systems typically include a mode register set (MRS) for programming and setting various operating modes for the memory system.

As background, a conventional memory will be described with reference to FIGS. 1–5.

FIG. 1 is a block diagram of a conventional memory system 10 with a memory device 30 and a memory controller 20. Generally, command and address information are supplied from the memory controller 20 to the memory 30, and data is passed therebetween in response to the command and address information.

FIG. 2 shows a data processing block diagram of a conventional memory device 30. As shown, the memory device 30 includes input buffers 40, 50, Mode Register Set (MRS) Generator 60, Command Decoder 70, Row Address Buffer 80, Column Address Buffer 90, Internal Column Address Generator 100, Row Decoder 110, Column Decoder 120, Burst Length Counter 130, Memory Cell Array 140, Sense Amplifier 150, and Data Input/Output Buffer 160. The operation of these processing blocks is described in more detail below.

FIG. 3 shows the relationship between an address signal MA (having bits 1:n) and the contents of an MRS table. As shown, the address bits MA, which are supplied from the memory controller 20, are used to set various operating modes such as DLL reset, test mode (TM), CAS Latency (CL), burst type (BT), and burst length (BL).

FIG. 4 illustrates an MRS command sequence whereby the memory controller 20 communicates burst length mode to the memory device 30. During a power-up sequence, the memory controller 20 communicates an MRS command 170 to the memory device 30. Although not shown, this is done by setting a corresponding combination of logical values for command lines typically designated as CS_BAR, RAS_BAR, CAS_BAR, and WE_BAR. Meanwhile, the bits MA<0:m> and MA<m+1:n> bits of the mode address signal communicated during the MRS command sequence via the address lines ADDER<0:m> and ADDR<m+1:n>, respectively, and communicate various operating mode parameters of the memory device 30 shown in FIG. 3. In the example of FIGS. 3 and 4, the bits A2, A1 and A0 of the address signal are 0, 1, 0 when the MRS command 170 is issued during power-up, and accordingly, the burst length is set to 4Later, during normal operation, another MRS command is issued with the bits A2, A1 and A0 of the address signal being 0, 0, 1, and accordingly, the burst length is changed to 2.

The general operation of functional blocks of FIG. 2 will now be described with respect to the setting of a burst length. The Command Decoder 70 decodes the MRS Command from the corresponding combination of logical values of the CS_BAR, RAS_BAR, CAS_BAR, and WE_BAR lines. In response to detecting an MRS Command, the Command Decoder 70 sets an MRS signal or flag to enable the MRS Generator 60 to receive the mode address signal communicated via the ADDR<0:m> and ADDR<m+1:n> address lines. The corresponding operating mode parameters are then stored in the MRS table of the memory device 30.

One such operating mode parameter of the memory device 30 is the burst length (BL). The "burst length" indicates the number of continuous operations (e.g., data reads and data writes) performed in a data burst mode. For example, when BL=4, in response to a data READ command four consecutive data read operations are performed, even though only one memory address is provided from the memory controller 20 to the memory device 30.

When the memory controller 20 wants to read or write data to or from the memory cell array 140, it sends a corresponding memory access (READ or WRITE) command to the memory device 30, together with a row address and a column address on the address lines ADDR<0:n>. The memory controller 20 indicates the READ and WRITE commands by setting corresponding combinations of logical values for the CS_BAR, RAS_BAR, CAS_BAR, and WE_BAR lines, which are in turn decoded by the Command Decoder 70. The row and column addresses received by the memory device 30 via the address lines ADDR<0:n> are buffered by input buffers 40 and 50, and supplied to the Row Address Buffer 80 and Column Address Buffer 90, respectively. The Row Address Buffer 80 generates a row address RA.

Meanwhile, the MRS Generator 60 provides a burst length selection signal MRS_BLi to the Burst Length Counter 130. The burst length selection signal MRS_BLi is generated corresponding to the burst length BL communicated from the memory controller 20 to the memory device 30 and stored in the MRS register, as generally discussed above and specifically shown in FIG. 4. The Burst Length Counter 130 uses the burst length selection signal MRS_BLi to count a desired burst period (e.g., BL=4) and generates a burst stop signal BS as a flag signal at the end of the specified burst period. The Burst Length Counter 130 provides the BS signal to the Internal Column Address Generator 100. The Internal Column Address Generator 100 also receives the column address CA. So long as the BS signal is active, the Internal Column Address Generator 100 generates an internal column address signal PCA<0:m>. The Internal Column Address Generator 100 provides the internal column address signal PCA<0:m> to the Column Address Buffer 90 which uses it to generate a column address CA.

The Row Decoder 110 receives the row address RA and generates therefrom a decoded row address, or word line WL, to activate a corresponding word line of the memory cell array 140. Similarly, the Column Decoder 120 receives the series of column address signals CA, corresponding to the burst length, and generates therefrom decoded column addresses, or column select lines CSL, to activate corresponding column lines of the memory cell array 140. The data is input/output from the memory cell array via sense amplifier 150 and data input/output buffer 160.

FIG. 5 illustrates how data is addressed in the Memory Cell Array 140 via the word line WL from the Row Decoder and the series of column select lines CSL corresponding to the burst length (e.g., BL=4).

Meanwhile, sometimes it is desired or necessary to change an operating mode of the memory device 30 in the memory system 10 after it has been initially set during the power-up sequence. For example, it may be desired or necessary to change the burst length from BL=4 to BL=2In that case, in the conventional memory system 10, it is necessary for the memory controller to issue another MRS command to the memory device 30 and to communicate a new set of operating mode parameters to be stored in the MRS table.

However, the repetition of MRS commands is inefficient and decreases the effective operating speed of the memory system 10.

Accordingly, it would be advantageous to provide a method and memory system that can select or change an operating mode of the memory device without issuing a new MRS command. Other and further objects will appear hereinafter.

SUMMARY OF THE INVENTION

According to one aspect of the invention, a memory device is provided which includes a memory cell array, a row decoder which selects a row of the memory cell array according to a multi-bit address signal, a column decoder which selects a column of the memory cell array according to the multi-bit address signal, and a mode control circuit which receives at least one bit from the multi-bit address signal used in the selection of the row or the column by the row decoder or column decoder, respectively, and which sets an operating mode of the memory device according to the at least one bit, where the operating mode is one of a burst length mode, a DLL reset mode, a test mode, a CAS latency mode, and a burst type mode.

According to another aspect of the invention, a memory device is provided which includes a memory cell array, a row decoder which is responsive to a row active command to select a row of the memory cell array according to n-bits of a multi-bit address signal, and a column decoder which is responsive to a read command and a write command to select a column of the memory cell array according to m-bits of the multi-bit address signal, where n>m, where n−m=a, and where a≧1; and a mode control circuit which receives at least one of a-bits from the multi-bit address signal used in the selection of the column by the column decoder during execution of at least one of the read and write commands, and which sets an operating mode of the memory device according to the one to a-bits, wherein the operating mode is at least one of a burst length mode, a DLL reset mode, a test mode, a CAS latency mode, and a burst type mode.

In yet another aspect of the invention, a memory device comprises a memory cell array; a first mode generation circuit which is responsive to a mode setting command to output a first mode selection signal; a row decoder which selects a row of the memory cell array according to a multi-bit address signal; a column decoder which selects a column of the memory cell array according to the multi-bit address signal; a second mode generation circuit which receives at least one bit from the multi-bit address signal used in the selection of the row or the column by the row decoder or column decoder, respectively, and which outputs a second mode selection signal according to the at least one bit; and a mode control circuit which sets an operating mode of the memory device according to the one of the first and second mode selection signals.

In still another aspect of the invention, a memory device comprises a memory cell array; a first mode generation circuit which is responsive to a mode setting command to output sets a first mode selection signal; a row decoder which is responsive to a row active command to select a row of the memory cell array according to n-bits of a multi-bit address signal; a column decoder which is responsive to a read command and a write command to select a column of the memory cell array according to m-bits of the multi-bit address signal, where n>m, where n−m=a, and where a≧1; a second mode generation circuit which receives one to a-bits from the multi-bit address signal used in the selection of the column by the column decoder during execution of at least one of the read and write commands, and which outputs a second mode selection signal according to the at least one of the one to a-bits; and a mode control circuit which sets an operating mode of the memory device according to one of the first and second mode selection signals.

In a further aspect of the invention, a memory system comprises: a memory controller which outputs a multi-bit address signal; and a memory device which receives the multi-bit address signal from the memory controller; wherein the memory device comprises: a memory cell array; a row decoder which selects a row of the memory cell array according to the multi-bit address signal; a column decoder which selects a column of the memory cell array according to the multi-bit address signal; a mode control circuit which receives at least one bit from the multi-bit address signal used in the selection of the row or the column by the row decoder or column decoder, respectively, and which sets an operating mode of the memory device according to the at least one bit, wherein the operating mode is one of a burst length mode, a DLL reset mode, a test mode, a CAS latency mode, and a burst type mode.

In yet a further aspect of the invention, a memory system comprises: a memory controller which outputs a multi-bit address signal and a selected one of a mode setting command, a row active command, a read command and a write command; and a memory device which receives the multi-bit address signal from the memory controller; wherein the memory device comprises: a memory cell array; a row decoder which is responsive to the row active command to select a row of the memory cell array according to n-bits of a multi-bit address signal; a column decoder which is responsive to the read command and the write command to select a column of the memory cell array according to m-bits of the multi-bit address signal, where n>m, where n−m=a, and where a≧1; a mode control circuit which receives one to a-bits from the multi-bit address signal used in the selection of the column by the column decoder during execution of at least one of the read and write commands, and which sets an operating mode of the memory device according to the one to a-bits, wherein the operating mode is at least one of a burst length mode, a DLL reset mode, a test mode, a CAS latency mode, and a burst type mode.

In a still further aspect of the invention, a memory system comprises: a memory controller which outputs a multi-bit address signal and a selected one of a mode setting command, a row active command, a read command and a write command; and a memory device which receives the multi-bit address signal, the mode setting command, the row active command, the read command and the write command from the memory controller; wherein the memory device comprises a memory cell array; a first mode generation circuit which is responsive to the mode setting command to output sets a first mode selection signal according to the multi-bit address signal; a row decoder which is responsive to the row active command to select a row of the memory cell array according to n-bits of a multi-bit address signal; a column decoder which is responsive to the read command and the write command to select a column of the memory cell array according to m-bits of the multi-bit address signal, where n>m, where n−m=a, and where a>1; a second mode generation circuit which receives at least one of a-bits of the multi-bit address signal which are unused in the selection of the column by the column decoder during execution of at least one of the read and write commands, and which outputs a second mode selection signal according to the at least one of the a-bits; and a mode control circuit which sets an operating mode of the memory device according to one of the first and second mode selection signals.

In a yet further aspect of the invention, a method of setting an operating mode of a memory device having a memory array comprises receiving a multi-bit address signal; decoding the multi-bit address signal to select a row of the memory array in response to a row active command; decoding the multi-bit address signal to select a column of the memory array in response to one of a read command and a write command; and setting an operating mode of the memory device according to at least one bit from the multi-bit address signal used in the selection of the row or the column, wherein the operating mode is at least one of a burst length mode, a DLL reset mode, a CAS latency mode, and a burst type mode.

In a yet still further aspect of the invention, a method for setting an operating mode of a memory device having a memory array comprises receiving a multi-bit address signal and one of a read command and a write command; in response to the one of the command and write command, selecting a column of the memory cell array according to m-bits of the multi-bit address signal, where n>m, where n−m=a, and where a≧1; and setting an operating mode of the memory device according to one to a-bits of the multi-bit address signal used in selecting the column in response to the one of the read and write commands, wherein the operating mode is at least one of a burst length mode, a DLL reset mode, a test mode, a CAS latency mode, and a burst type mode.

In another yet still further aspect of the invention, a method for setting an operating mode of a memory device having a memory array comprises: receiving a mode setting command; generating a first mode selection signal in response to the mode setting command; receiving a multi-bit address signal; decoding the multi-bit address signal to select a row of the memory array in response to a row active command; decoding the multi-bit address signal to select a column of the memory array in response to a one of a read command and a write command; generating outputs a second mode selection signal according to at least one bit from the multi-bit address signal used in the selection of the row or the column; and a mode control circuit which sets an operating mode of the memory device according to the one of the first and second mode selection signals.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF THE PREFERRED EMBODIMENTS

The present invention will now be described in detail with reference to preferred but non-limiting embodiments of the invention.

Figure 6:
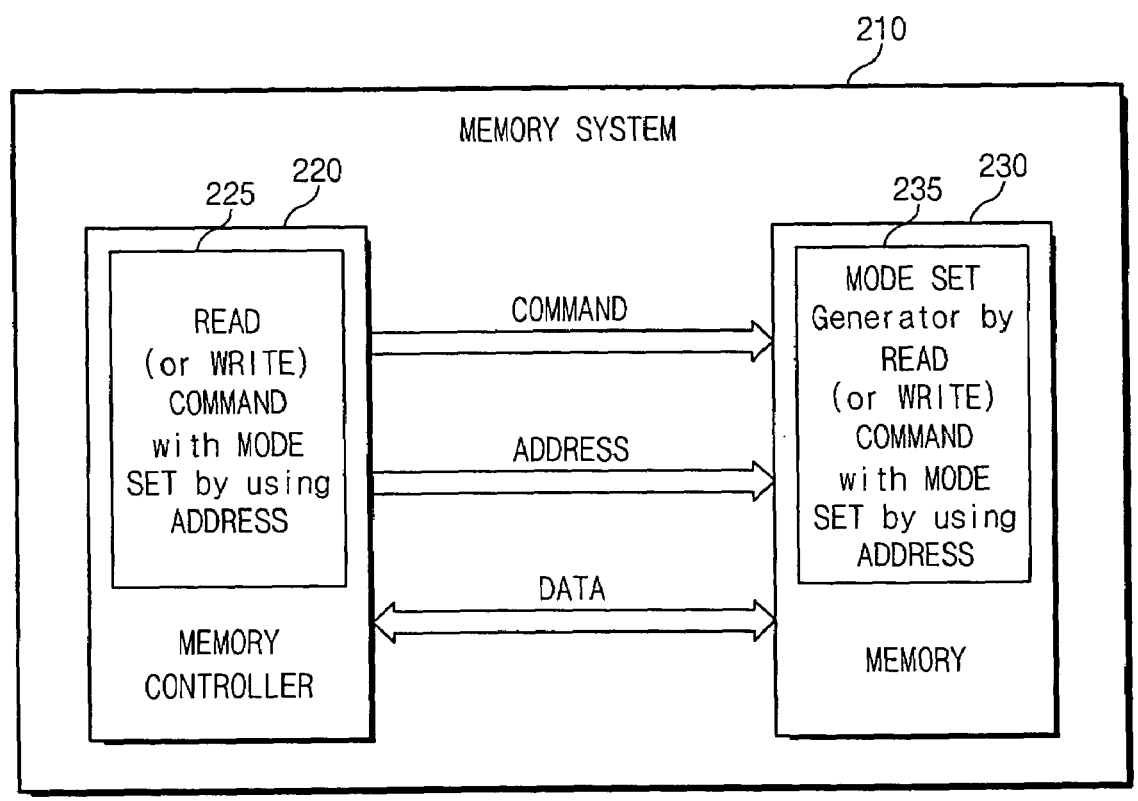
FIG. 6 shows a block diagram of a first embodiment of a memory system according to one or more aspects of the present invention.

FIG. 6 shows a block diagram of a first embodiment of a memory system 210. The memory system 210 includes a memory controller 220 and a memory device 230. As explained in further detail below, the memory controller includes unit 225 for generating and communicating an operating mode parameter using a multi-bit address signal transmitted together with the READ or WRITE command. Meanwhile, the memory device 230 includes a mode set generator 235 for setting an operating mode of the memory device 230 in accordance with an operating mode parameter received via the address lines during a data read or write operation.

Figure 7:
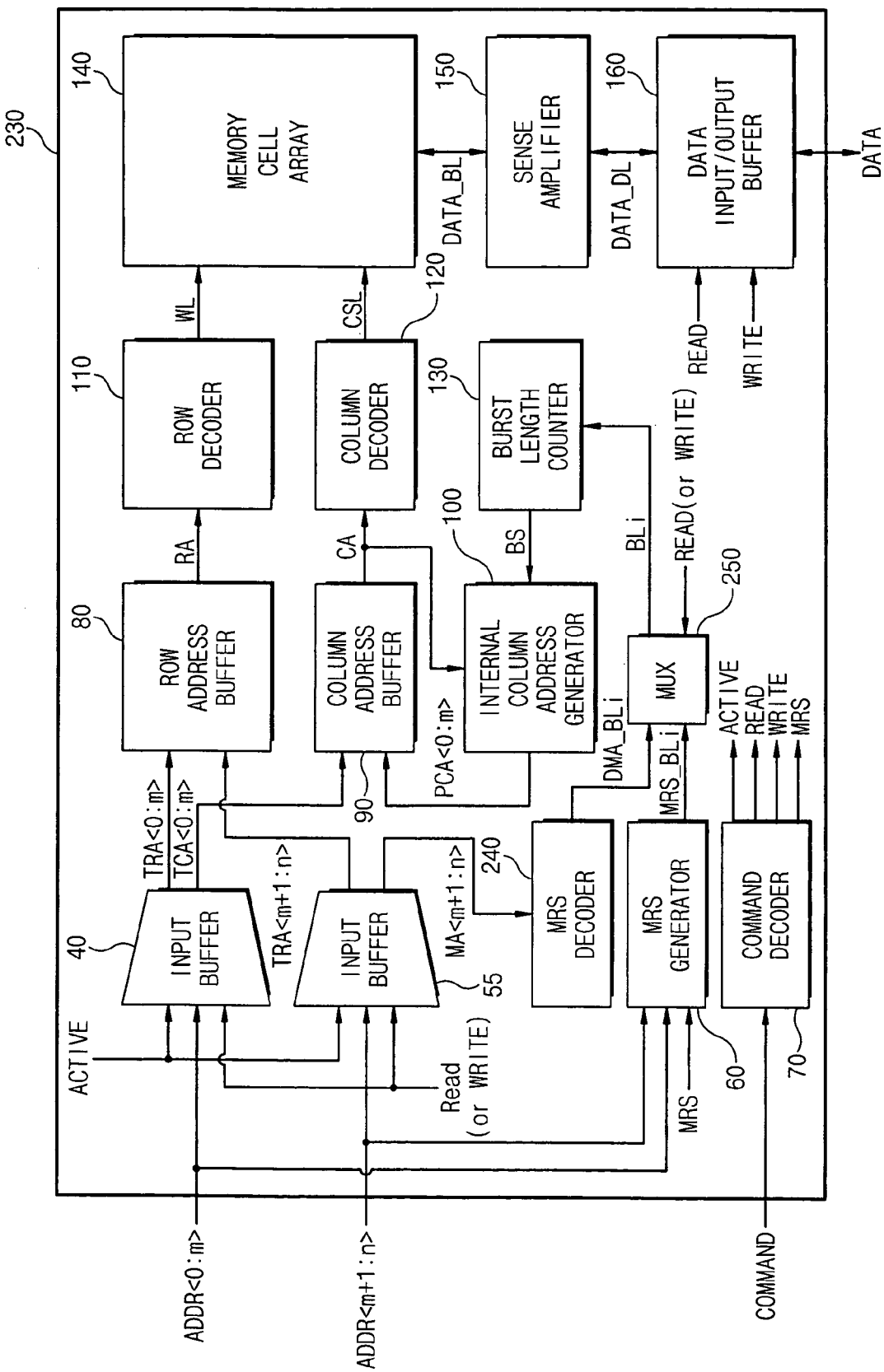
FIG. 7 shows a data processing block diagram of a first embodiment of a memory device.

FIG. 7 shows a data processing block diagram of a first embodiment of a memory device 230. The memory device 230 includes input buffers 40, 55, Mode Register Set (MRS) Generator 60, Command Decoder 70, Row Address Buffer 80, Column Address Buffer 90, Internal Column Address Generator 100, Row Decoder 110, Column Decoder 120, Burst Length Counter 130, Memory Cell Array 140, Sense Amplifier 150, Data Input/Output Buffer 160, MRS Decoder 240, and MUX 250.

Figure 1:
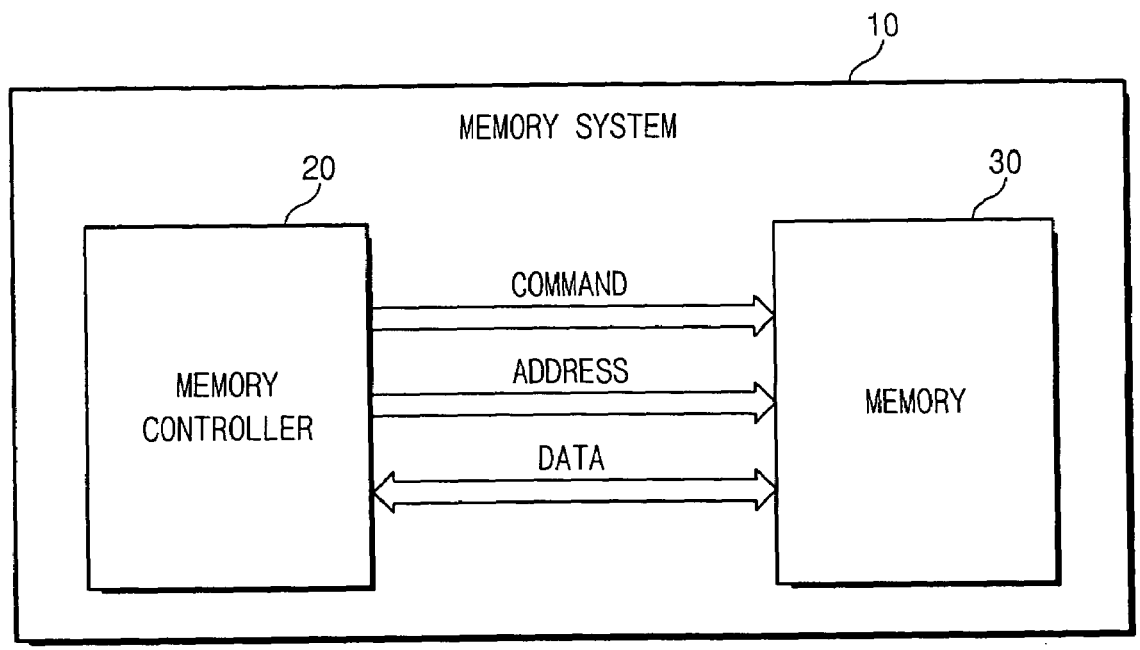
FIG. 1 is a block diagram of a conventional memory system.
Figure 2:
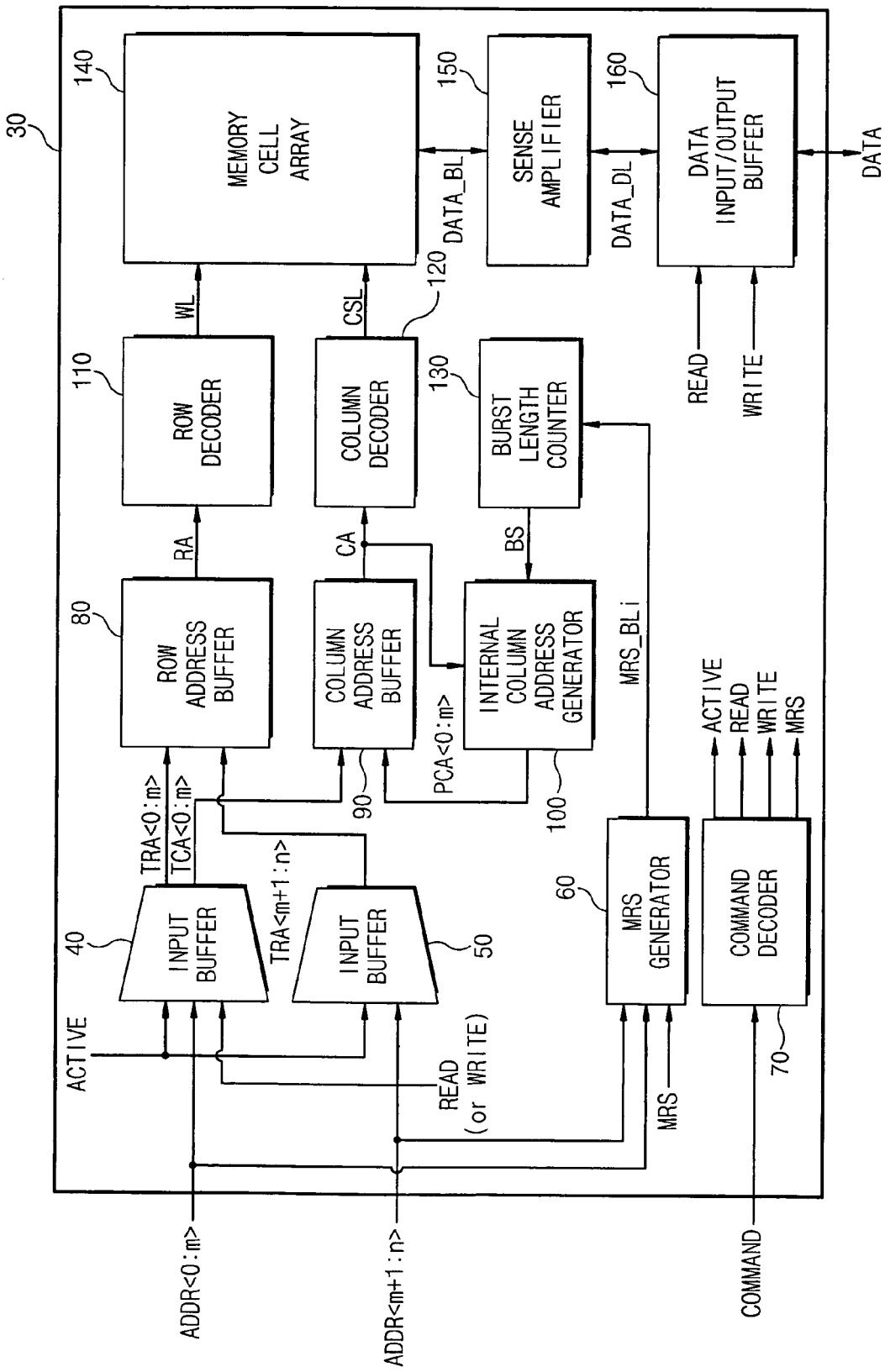
FIG. 2 shows a data processing block diagram of a conventional memory device.
Figure 3:
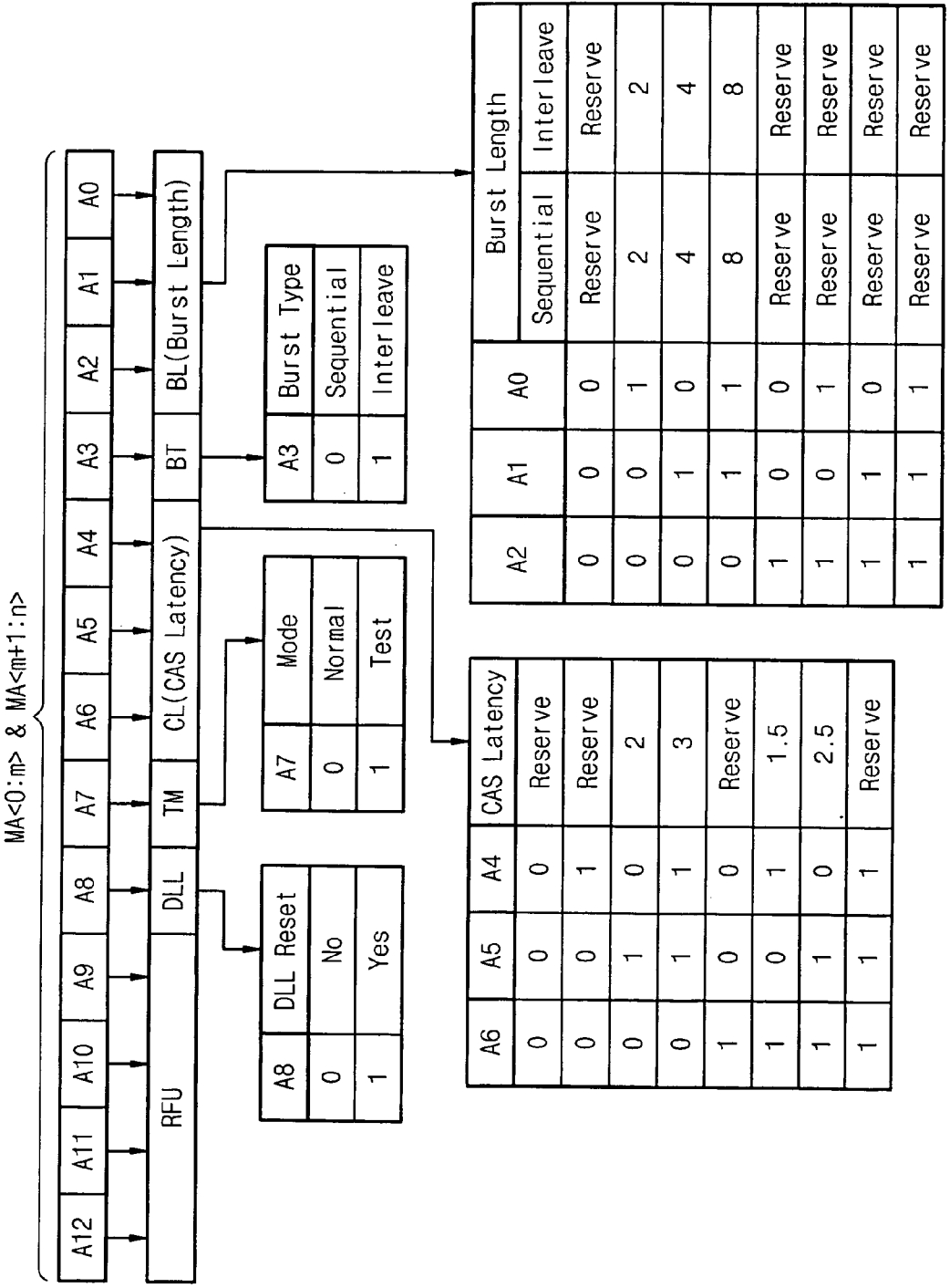
FIG. 3 shows an MRS table of a conventional memory device.
Figure 4:
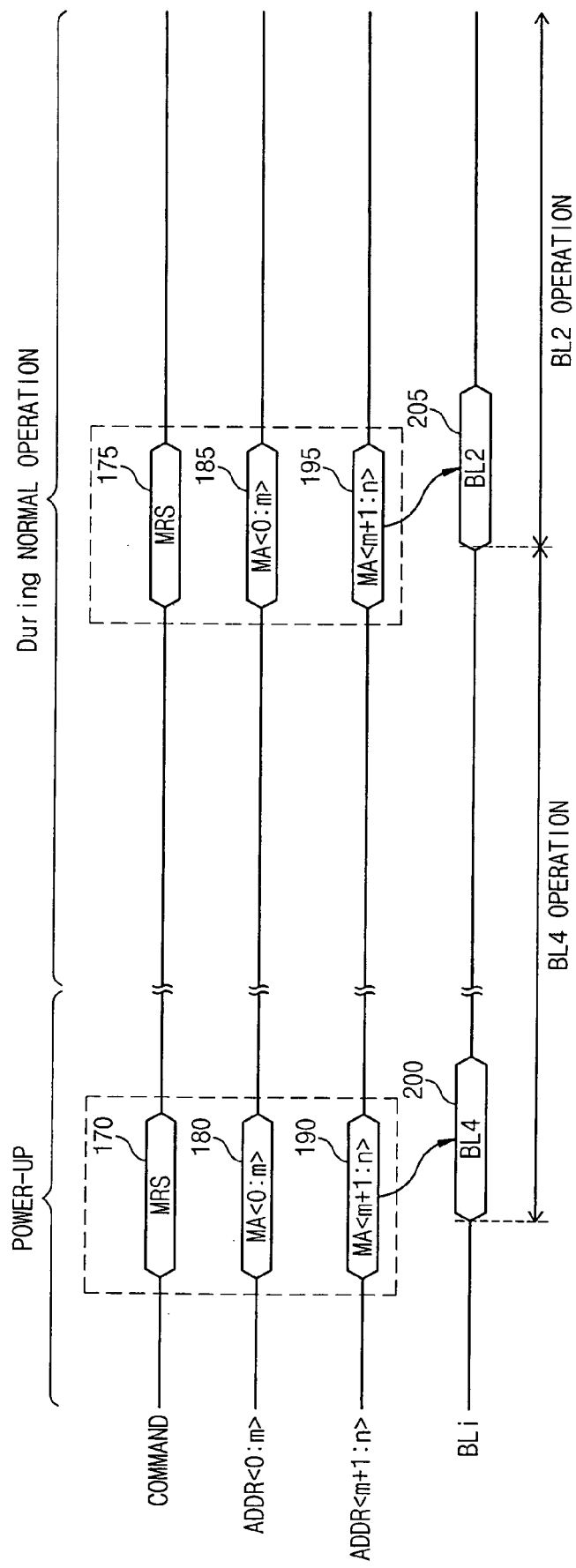
FIG. 4 illustrates an MRS command sequence.
Figure 5:
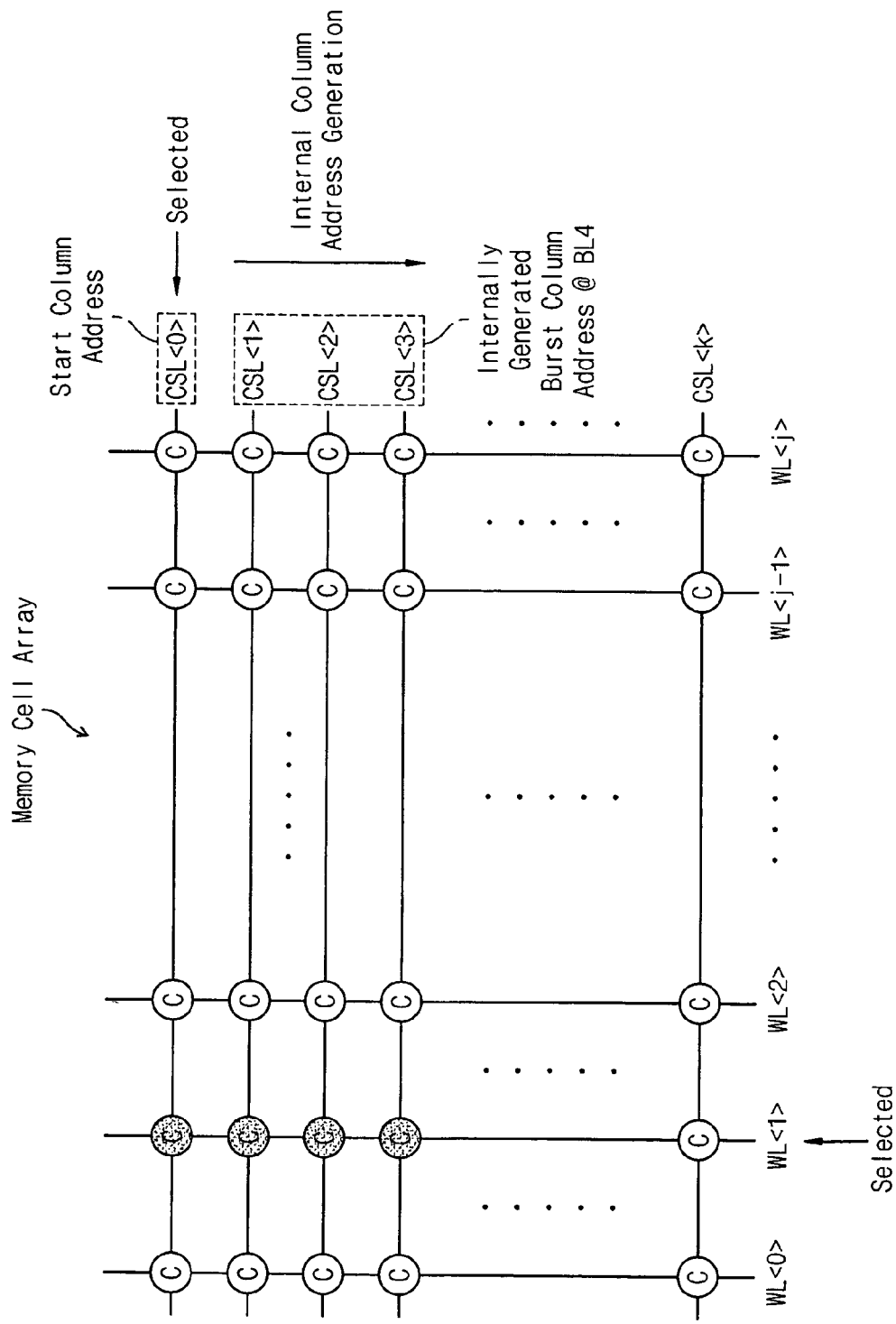
FIG. 5 illustrates how data is addressed in a memory cell array.

During a power-up sequence, the memory controller 220 communicates an MRS command to the memory device 230, and sets one or more operating modes for the memory device using the ADDR<0:m> and ADDR<m+1:n> address lines during an MRS command sequence, as explained above with respect to FIGS. 3 and 4. The operating mode selections are received by the memory device 30 and stored in the MRS table of the memory device 30.

Subsequently, it may be desired or necessary to change an operating mode of the memory device 230 in the memory system 210 after it has been initially set during the power-up sequence. For example, it may be desired or necessary to change the burst length from BL=4 to BL=2.

In that case, in the memory system 210, one or more operating modes that are normally selected by data stored in the MRS table of the memory device 230 may be selected or changed without generating any additional MRS command. More specifically, the operating mode(s) of the memory device 230 may be selected or changed using a column access command received from the memory controller 220. Beneficially, the operating mode(s) may be a one or more of a burst length mode, a DLL reset mode, a test mode, a CAS latency mode, and a burst type mode.

Figure 8:
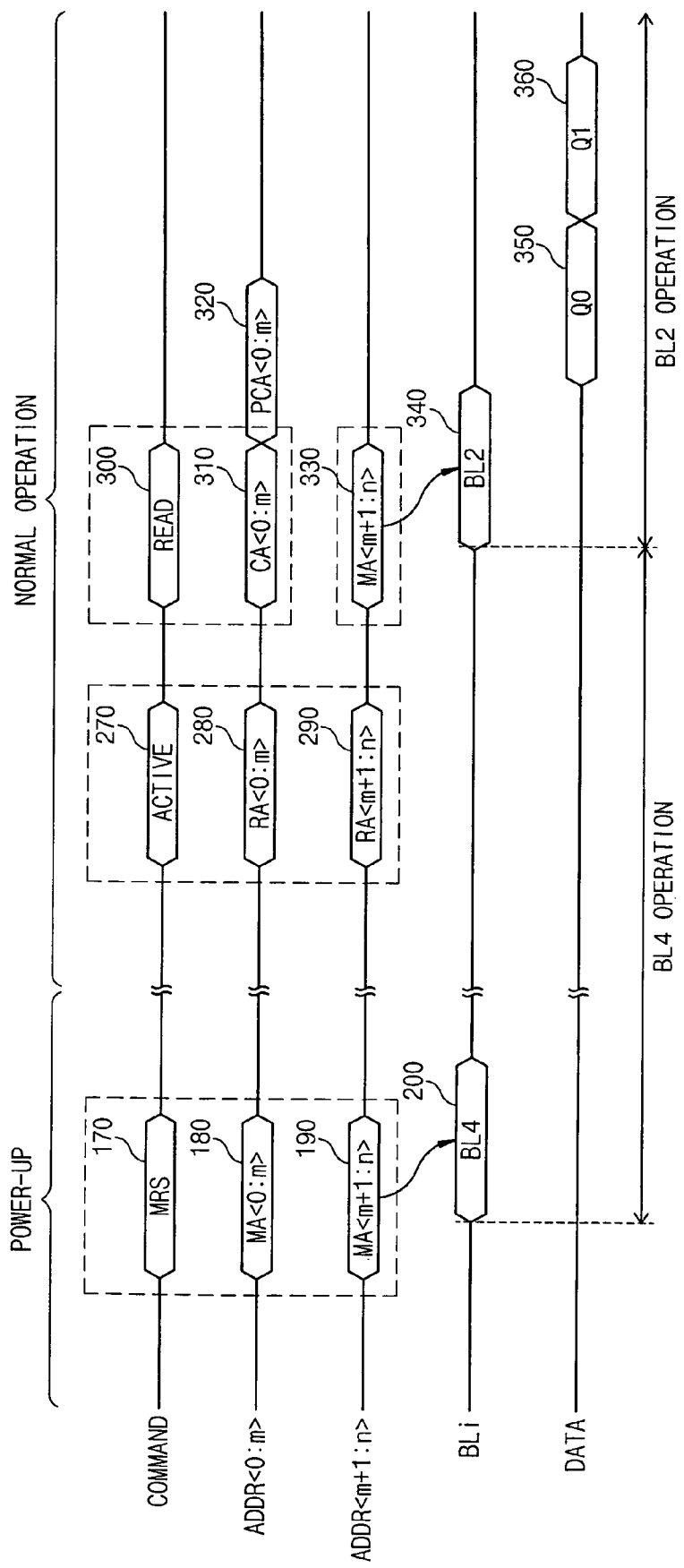
FIG. 8 illustrates a method for communicating operating mode parameters to a memory device during a data read operation.

FIG. 8 illustrates a method for communicating operating mode parameters to the memory device 230 during a data read operation. In the example of FIG. 8, the operating mode is a data burst length. However, it should be understood that the operating mode could be a DLL reset mode, a test mode, a CAS latency mode, and a burst type mode such as are stored in the MRS table.

As shown in FIG. 8, during power-up, an initial burst length mode 200, BL=4, is selected for the memory device 230 by the MRS Command 170, in conjunction with the mode address signals MA<0:m> 180 and MA<m+1:n> 190 communicated via the address lines ADDR<0:m> and ADDR<m+1:n> respectively.

Subsequently, during a data read operation, the memory device 230 first receives a ROW ACTIVE command 270, together with row address signals RA<0:m> 280 and RA<m+1:n> 290 on the address lines ADDR<0:n>. The ROW ACTIVE command 270 is indicated by a corresponding combination of logical values for the CS_BAR, RAS_BAR, CAS_BAR, and WE_BAR lines, which combination is decoded by the Command Decoder 70. The Row Address Buffer 80 uses the row address signals RA<0:m> 280 and RA<m+1:n> 290 to generate a row address RA, which is in turn decoded to a word line WL by the Row Decoder 110.

Next, the memory device 230 receives a READ command 300, together with a column address CA<0:m> 310 on the address lines ADDR<0:m>. The READ command 300 is indicated by a corresponding combination of logical values for the CS_BAR, RAS_BAR, CAS_BAR, and WE_BAR lines, which combination is decoded by the Command Decoder 70.

Advantageously, although all of the address lines ADDR<0:n> may be required for a refresh or row active operation for the memory device 230, not all of the address lines ADDR<0:n> are required during a column access (e.g., data read) operation. That is, only the address lines ADDR<0:m> (m<n) may be required for addressing the memory cell array 140 during a column access (e.g., data read) operation. In that case, there are one or more address lines ADDR<m+1:n> that are not used for addressing the memory cell array during the column access (e.g., data read) operation.

Accordingly, advantageously, one or more of those address lines ADDR<m+1:n> that are not used during a column access (e.g., data read) operation, are instead used to communicate one or more bits of a mode address signal MA<m+1:n> 330 selecting one or more operating modes for the memory device 230. In response to the mode address signal MA<m+1:n> 330, the memory device 230 selects a burst length mode 340, BL=2Although FIG. 8 illustrates a case where the operating mode is a burst length, beneficially the operating mode(s) may be at least one of a burst length mode, a DLL reset mode, a test mode, a CAS latency mode, and a burst type mode.

Figure 9:
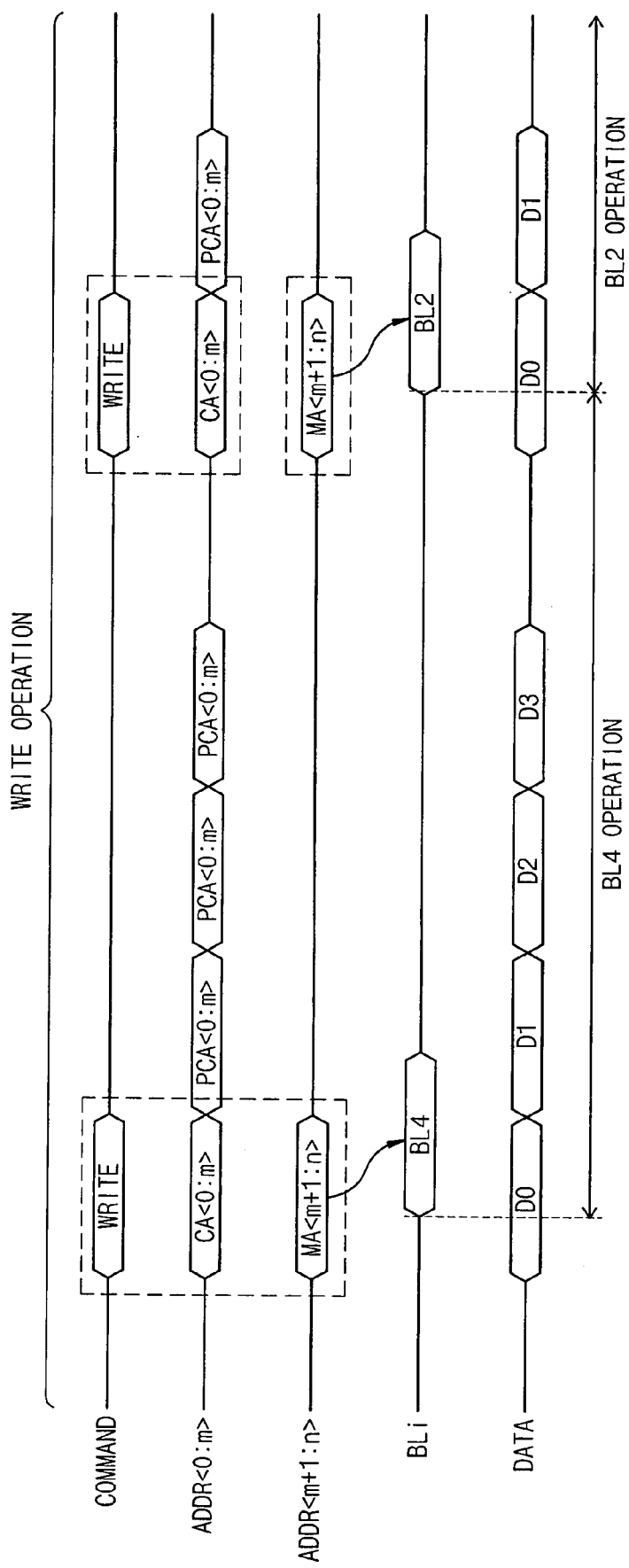
FIG. 9 illustrates a first data read operation having a burst length BL=4 followed by a second data read operation having a burst length BL=2.

FIG. 9 illustrates a sequence wherein a data burst mode is set to BL=4 via address lines ADDR<m+1:n> in response to a READ command for a first data read operation, and then is set to BL=2 via address lines ADDR<m+1:n> during a READ command for a second data read operation.

Figure 10:
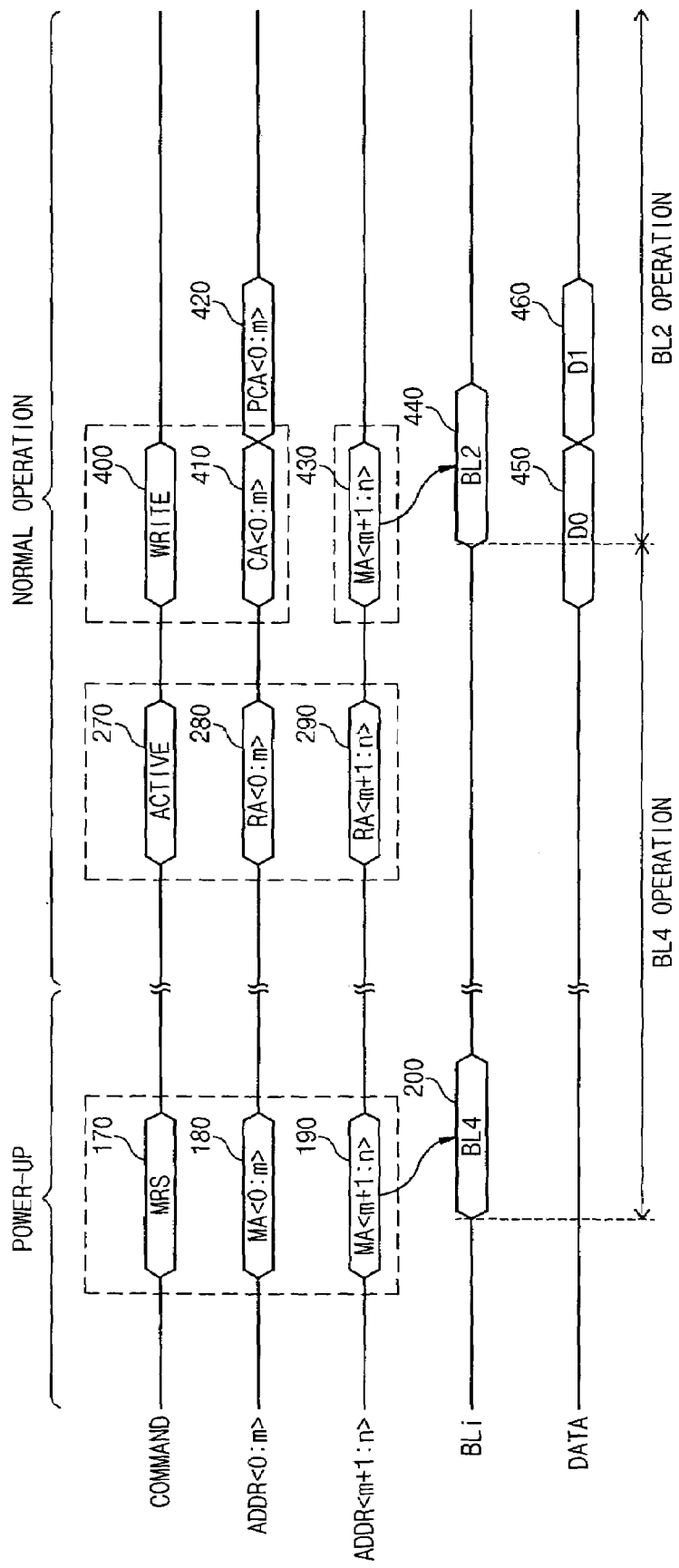
FIG. 10 illustrates a method for communicating operating mode parameters to a memory device during a data write operation.

FIG. 10 illustrates a method for communicating operating mode parameters to the memory device 230 during a data write operation. In the example of FIG. 10, the operating mode is a data burst length mode. However, it should be understood that the operating mode could be at least one of a burst length mode, a DLL reset mode, a test mode, a CAS latency mode, and a burst type mode, such as are stored in the MRS table.

As shown in FIG. 10, during power-up, an initial burst length mode 200, BL=4, is selected for the memory device 230 via the MRS Command 170, and the mode address signals MA<0:m> 180 and MA<m+1:n> 190 on the address lines ADDR<0:m> and ADDR<m+1:n> respectively.

Subsequently, during a data write operation, the memory device 230 first receives a ROW ACTIVE command 270, together with row address signals RA<0:m> 280 and RA<m+1:n> 290 on the address lines ADDR<0:n>. The ROW ACTIVE command 270 is indicated by a corresponding combination of logical values for the CS_BAR, RAS_BAR, CAS_BAR, and WE_BAR lines, which combination is decoded by the Command Decoder 70. The Row Address Buffer 80 uses the row address signals RA<0:m> 280 and RA<m+1:n> 290 to generate a row address RA, which is in turn decoded to a word line WL by the Row Decoder 110.

Next, the memory device 230 receives a WRITE command 400, together with a column address CA<0:m> 410 on the address lines ADDR<0:m>. The WRITE command 400 is indicated by a corresponding combination of logical values for the CS_BAR, RAS_BAR, CAS_BAR, and WE_BAR lines, which combination is decoded by the Command Decoder 70. Meanwhile, address lines ADDR<m+1:n> are used to communicate one or more bits MA<m+1:n> 430 of a mode address signal selecting one or more operating modes for the memory device 230. Although FIG. 10 illustrates a case where the operating mode is a burst length mode, beneficially the operating mode(s) may be at least one of a burst length mode, a DLL reset mode, a test mode, a CAS latency mode, and a burst type mode.

Figure 11:
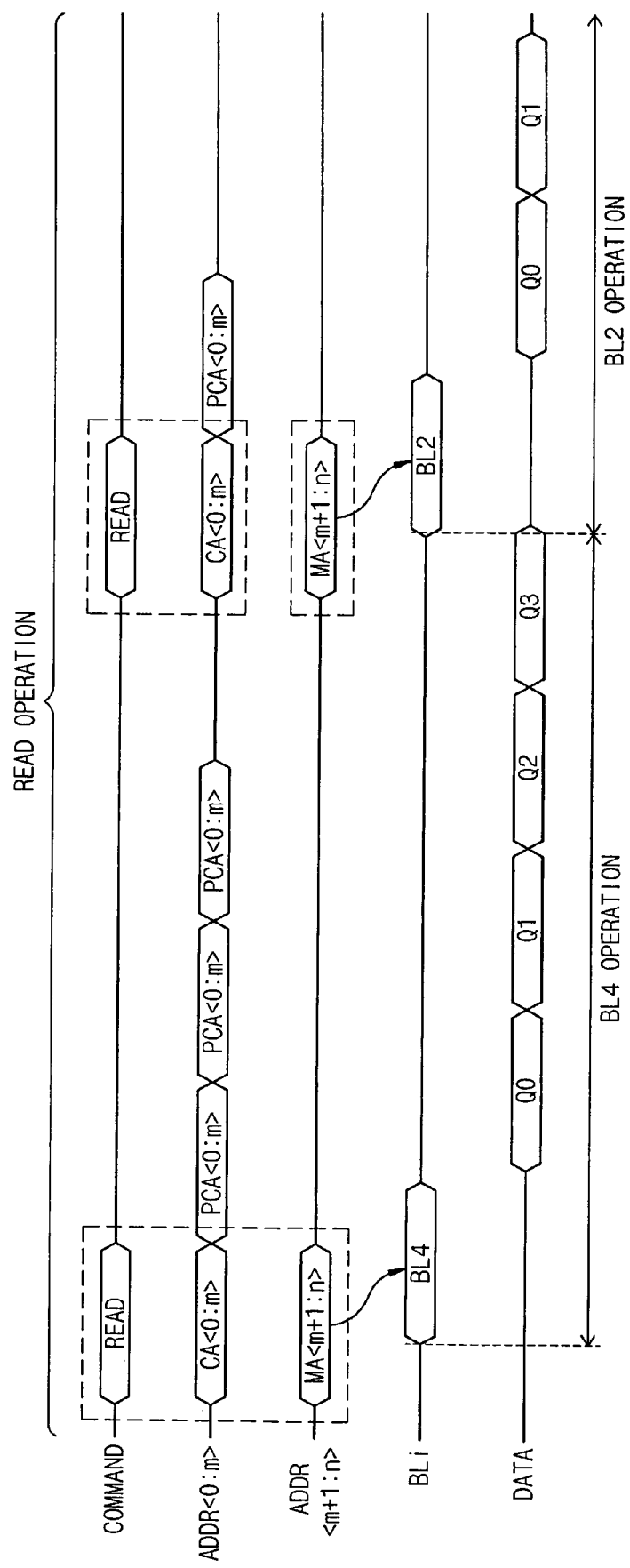
FIG. 11 illustrates a first data write operation having a burst length BL=4 followed by a second data write operation having a burst length BL=2.

FIG. 11 illustrates a sequence wherein a data burst mode is set to BL=4 via address lines ADDR<m+1:n> during a WRITE command for a first data write operation, and then is set to BL=2 via address lines ADDR<m+1:n> during a WRITE command for a second data write operation.

FIG. 7 illustrates how a burst length mode is selected for a data read or data write operation of the memory device 230.

The MRS Generator 60 generates a first burst length selection signal MRS_BLi indicating a burst length mode (e.g., BL=4) that was communicated to the memory device 230 and stored in the MRS register during an MRS command sequence, such as the power-up sequence shown in FIG. 8. The MRS Generator 60 provides the first burst length selection signal MRS_BLi to a MUX 250.

Meanwhile, mode address signal MA<m+1:n> received via address lines ADDR<m+1:n> during a data read or data write operation is provided to the MRS decoder 240. The MRS Decoder 240 decodes the mode address signal MA<m+1:n> to generate and output a second burst length selection signal DMA_BLi. The MRS Decoder 240 provides the second burst length selection signal DMA_BLi to the MUX 250. In the examples of FIGS. 8 and 10, the mode address signal MA<m+1:n> indicates a burst length mode, BL=2.

The MUX 250 outputs one of the first burst length selection signal MRS_BLi or the second burst length selection signal DMA_BLi as a burst length signal BLi, in response to the current command being executed by the memory device 230. That is, in response to the command being a READ or WRITE command, then MUX 250 outputs the second burst length selection signal DMA_BLi from the MRS Decoder 240 as the burst length signal BLi. Otherwise, the MUX 250 outputs the first burst length selection signal MRS_BLi from the MRS Generator 60 as the burst length signal BLi.

As before, the Burst Length Counter 130 uses the MRS_BLi to count a desired burst length period (e.g., BL=4) and generates a burst stop signal BS as a flag signal at the end of the specified burst period. The Burst Length Counter 130 provides the BS signal to the Internal Column Address Generator 100. The Internal Column Address Generator 100 also receives the column address CA. So long as the BS signal is active, the Internal Column Address Generator 100 generates an internal column address signal PCA<0:m> 320, 420. The Internal Column Address Generator 100 provides the internal column address signal PCA<0:m> 320, 420 to the Column Address Buffer 90, which in turn uses it to generate a column address signal CA. The Column Decoder 120 receives a series of column address signals CA corresponding to the burst length, and generates therefrom decoded column addresses, or column select lines, CSL to activate corresponding column lines of the memory cell array 140.

Figure 12:
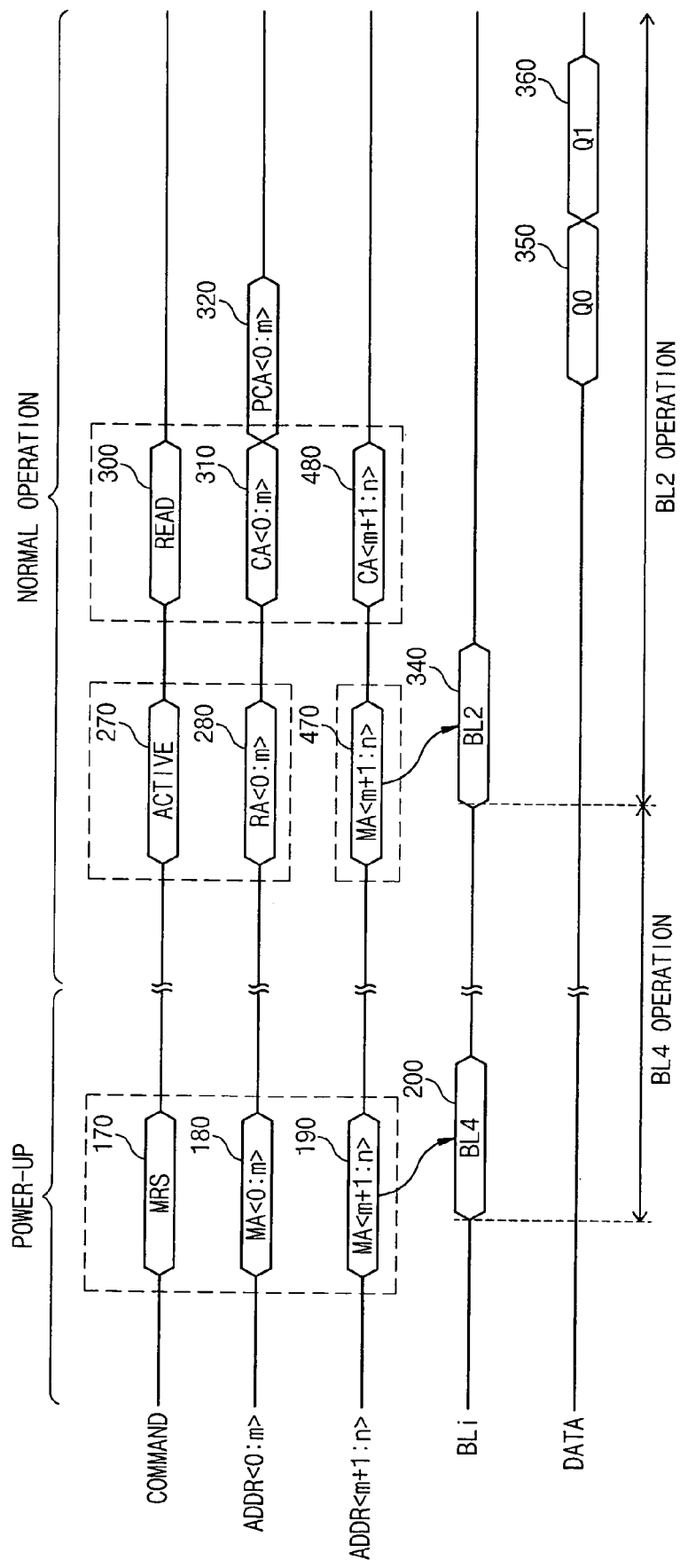
FIG. 12 illustrates a method for communicating operating mode parameters to a memory device during a row active operation.

In some memory devices, there may be available unused address lines ADDR<0:n> during a row active operation. FIG. 12 illustrates a method for communicating operating mode parameters to a memory device during a row active operation.

In the example of FIG. 12, the operating mode is a data burst length. However, it should be understood that the operating mode could be at least one of a burst length mode, a DLL reset mode, a test mode, a CAS latency mode, and a burst type mode, such as are stored in the MRS table.

As shown in FIG. 12, during power-up, an initial burst length mode 200, BL=4, is selected for the memory device 230 by the MRS Command 170, and the mode address signals MA<0:m> 180 and MA<m+1:n> 190 on the address lines ADDR<0:m> and ADDR<m+1:n> respectively.

Subsequently, during a row active operation, the memory device 230 receives a ROW ACTIVE command 270, together with row address signal RA<0:m> 280 on the address lines ADDR<0:m>. The Row Active command 270 is indicated by a corresponding combination of logical values for the CS_BAR, RAS_BAR, CAS_BAR, and WE_BAR lines, which combination is decoded by the Command Decoder 70. The Row Address Buffer 80 uses the row address signal RA<0:n> to generate a row address RA, which is in turn decoded to a word line WL by the Row Decoder 110. Meanwhile, address lines ADDR<m+1:n> are used to communicate one or more bits of a mode address signal MA<m+1:n> 470 for selecting one or more operating modes for the memory device 230. Although FIG. 12 illustrates a case where the operating mode is a burst length mode, beneficially the operating mode(s) may be at least one of a burst length mode, a DLL reset mode, a test mode, a CAS latency mode, and a burst type mode.

Next, the memory device 230 receives a READ command 300, together with column address signals CA<0:m> 310 and CA<m+1,n> 480 on the address lines ADDR<0:m> and ADDR<m+1,n>, respectively. The READ command 300 is indicated by a corresponding combination of logical values for the CS_BAR, RAS_BAR, CAS_BAR, and WE_BAR lines, which combination is decoded by the Command Decoder 70.

In all of the above embodiments, the bits of the mode address signal MA<m+1:n> can be used in a variety of ways to select the burst length of the memory device 230. For example, in one case the mode address signal may comprise two bits, A9 and A10. In that case, for example, A9_A10=10 may indicate a burst length mode BL=1, A9_A10=01 may indicate a burst length mode BL=2, A9_A10=11 may indicate a burst length mode BL=4, and A9_A10=00 may indicate that the burst length remains unchanged from its previous value. In that case, A9_A10=00 may be a default condition.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. A memory device, comprising:
    a memory cell array;
    a row decoder which selects a row of the memory cell array according to a multi-bit address signal;
    a column decoder which selects a column of the memory cell array according to the multi-bit address signal; and
    a mode control circuit which receives at least one bit of the multi-bit address signal used in the selection of the row or the column by the row decoder or column decoder, respectively, and which sets an operating mode of the memory device according to the at least one bit, wherein the operating mode is at least one of a burst length mode, a DLL reset mode, a test mode, a CAS latency mode, and a burst type mode.

2. The device of claim 1, wherein the operating mode is a burst length mode.

3. The device of claim 1, further comprising a mode register set (MRS) generator which receives the at least one bit.

4. The device of claim 1, wherein the at least one bit is not used in the selection of the row or the column by the row decoder or column decoder, respectively.

5. A memory device, comprising:
    a memory cell array;
    a row decoder which is responsive to a row active command to select a row of the memory cell array according to n-bits of a multi-bit address signal;
    a column decoder which is responsive to a read command and a write command to select a column of the memory cell array according to m-bits of the multi-bit address signal, where n>m, where n−m=a, and where a≧1; and
    a mode control circuit which receives at least one of a-bits of the multi-bit address signal which are unused in the selection of the column by the column decoder during execution of at least one of the read and write commands, and which sets an operating mode of the memory device using the at least one of the a-bits.

6. The device of claim 5, wherein the operating mode is a burst length mode.

7. The device of claim 5, wherein the operating mode is at least one of a DLL reset mode, a test mode, a CAS latency mode, and a burst type mode.

8. The device of claim 5, further comprising a mode register set (MRS) generator which receives the at least one bit.

9. A memory device, comprising:
a memory cell array;
a first mode generation circuit which is responsive to a mode setting command to output a first mode selection signal;
a row decoder which selects a row of the memory cell array according to a multi-bit address signal;
a column decoder which selects a column of the memory cell array according to the multi-bit address signal;
a second mode generation circuit which receives at least one bit from the multi-bit address signal used in the selection of the row or the column by the row decoder or column decoder, respectively, and which outputs a second mode selection signal according to the at least one bit; and
a mode control circuit which sets an operating mode of the memory device according to the one of the first and second mode selection signals.

10. The device of claim 9, wherein the operating mode is a burst length mode.

11. The device of claim 9, wherein the operating mode is at least one of a burst length mode, a DLL reset mode, a test mode, a CAS latency mode, and a burst type mode.

12. The device of claim 9, wherein the at least one bit is at least one unused bit of the multi-bit address signal used in the selection of the row or the column.

13. The device of claim 9, further comprising a decoder which decodes the multi-bit address signal to obtain the at least one bit.

14. The device of claim 9, wherein the mode control circuit comprises a multiplexer that switches between the first and second mode selection signals in response to at least one control signal.

15. The device of claim 14, further including a command decoder for decoding commands from a plurality of input signals, and wherein the at least one control signal includes at least one decoded command from the command decoder.

16. The device of claim 15, wherein the at least one control signal includes at least one of a decoded READ command a decoded WRITE command, and a decoded MRS command.

17. A memory device, comprising:
a memory cell array;
a first mode generation circuit which is responsive to a mode setting command to output sets a first mode selection signal;
a row decoder which is responsive to a row active command to select a row of the memory cell array according to n-bits of a multi-bit address signal;
a column decoder which is responsive to a read command and a write command to select a column of the memory cell array according to m-bits of the multi-bit address signal, where n>m, where n−m=a, and where a≧1;
a second mode generation circuit which receives one to a-bits from the multi-bit address signal used in the selection of the column by the column decoder during execution of at least one of the read and write commands, and which outputs a second mode selection signal according to the at least one of the one to a-bits; and
a mode control circuit which sets an operating mode of the memory device according to one of the first and second mode selection signals.

18. The device of claim 17, wherein the operating mode is a burst length mode.

19. The device of claim 17, wherein the operating mode is at least one of a burst length mode, a DLL reset mode, a test mode, a CAS latency mode, and a burst type mode.

20. The device of claim 17, wherein the at least one bit is at least one unused bit of the multi-bit address signal used in the selection of the row or the column.

21. The device of claim 17, further comprising a decoder which decodes the multi-bit address signal to obtain the at least one bit.

22. The device of claim 17, wherein the mode control circuit comprises a multiplexer that switches between the first and second mode selection signals in response to at least one control signal.

23. The device of claim 22, further including a command decoder for decoding commands from a plurality of input signals, and wherein the at least one control signal includes at least one decoded command from the command decoder.

24. The device of claim 23, wherein the at least one control signal includes at least one of a decoded READ command, a decoded WRITE command, and a decoded MRS command.

25. A memory system, comprising:
a memory controller which outputs a multi-bit address signal; and
a memory device which receives the multi-bit address signal from the memory controller;
wherein the memory device comprises:
a memory cell array;
a row decoder which selects a row of the memory cell array according to the multi-bit address signal;
a column decoder which selects a column of the memory cell array according to the multi-bit address signal;
a mode control circuit which receives at least one bit from the multi-bit address signal used in the selection of the row or the column by the row decoder or column decoder, respectively, and which sets an operating mode of the memory device according to the at least one bit,
wherein the operating mode is one of a burst length mode, a DLL reset mode, a test mode, a CAS latency mode, and a burst type mode.

26. The system of claim 25, further comprising a mode register set (MRS) generator which receives the at least one bit.

27. The system of claim 25, wherein the at least one bit is at least one unused bit of the multi-bit address signal used in the selection of the row or the column.

28. The system of claim 25, wherein the memory device further comprises a decoder which decodes the multi-bit address signal to obtain the at least one bit.

29. The system of claim 25, further comprising a plurality of data lines connected between the memory controller and the memory device for carrying bursts of data communicated in accordance with the burst length mode.

30. A memory system, comprising:
a memory controller which outputs a multi-bit address signal and a selected one of a mode setting command, a row active command, a read command and a write command; and
a memory device which receives the multi-bit address signal from the memory controller;
wherein the memory device comprises:
a memory cell array;
a row decoder which is responsive to the row active command to select a row of the memory cell array according to n-bits of a multi-bit address signal;

a column decoder which is responsive to the read command and the write command to select a column of the memory cell array according to m-bits of the multi-bit address signal, where n>m, where n−m=a, and where a≧1;

a mode control circuit which receives at least one of a-bits from the multi-bit address signal used in the selection of the column by the column decoder during execution of at least one of the read and write commands, and which sets an operating mode of the memory device according to the one to a-bits, wherein the operating mode is at least one of a burst length mode, a DLL reset mode, a test mode, a CAS latency mode, and a burst type mode.

31. The system of claim 30, further comprising a mode register set (MRS) generator which receives the at least one bit.

32. The system of claim 30, wherein the at least one of a-bits includes at least one unused bit of the multi-bit address signal used in the selection of the row or the column.

33. The system of claim 30, wherein the memory device further comprises a decoder which decodes the multi-bit address signal to obtain the at least one of a-bits.

34. The system of claim 30, further comprising a plurality of data lines connected between the memory controller and the memory device for carrying bursts of data communicated in accordance with the burst length mode.

35. A memory system, comprising:

a memory controller which outputs a multi-bit address signal and a selected one of a mode setting command, a row active command, a read command and a write command; and a memory device which receives the multi-bit address signal, the mode setting command, the row active command, the read command and the write command from the memory controller;

wherein the memory device comprises:

a memory cell array;

a first mode generation circuit which is responsive to the mode setting command to output sets a first mode selection signal according to the multi-bit address signal;

a row decoder which is responsive to the row active command to select a row of the memory cell array according to n-bits of a multi-bit address signal;

a column decoder which is responsive to the read command and the write command to select a column of the memory cell array according to m-bits of the multi-bit address signal, where n>m, where n−m=a, and where a≧1;

a second mode generation circuit which receives at least one of a-bits of the multi-bit address signal which are unused in the selection of the column by the column decoder during execution of at least one of the read and write commands, and which outputs a second mode selection signal according to the at least one of the a-bits; and a mode control circuit which sets an operating mode of the memory device according to one of the first and second mode selection signals.

36. The system of claim 35, wherein the operating mode is a burst length mode.

37. The system of claim 35, wherein the operating mode is at least one of a burst length mode, a DLL reset mode, a test mode, a CAS latency mode, and a burst type mode.

38. The system of claim 35, wherein the at least one bit is at least one unused bit of the multi-bit address signal used in the selection of the row or the column.

39. The system of claim 38, wherein the memory device further comprises a decoder which decodes the multi-bit address signal to obtain the at least one bit.

40. The system of claim 35, wherein the mode control circuit comprises a multiplexer that switches between the first and second mode selection signals in response to at least one control signal.

41. The system of claim 40, wherein the memory device further comprises a command decoder for decoding commands from a plurality of input signals, and wherein the at least one control signal includes at least one decoded command from the command decoder.

42. The system of claim 41, wherein the at least one control signal includes at least one of a decoded READ command, a decoded WRITE command, and a decoded MRS command.

43. The system of claim 35, further comprising a plurality of data lines connected between the memory controller and the memory device for carrying bursts of data communicated in accordance with the burst length mode.

44. A method for setting an operating mode of a memory device having a memory array, said method comprising:

receiving a multi-bit address signal;

decoding the multi-bit address signal to select a row or a column of the memory array; and setting an operating mode of the memory device using at least one bit from the multi-bit address signal used in the selection of the row or the column, wherein the operating mode is at least one of a burst length mode, a DLL reset mode, a CAS latency mode, and a burst type mode.

45. The method of claim 44, wherein the operating mode is a burst length mode.

46. The method of claim 44, wherein the at least one bit is at least one unused bit of the multi-bit address signal used in the selection of the row or the column.

47. A method for setting an operating mode of a memory device having a memory array, said method comprising:

receiving an n-bit multi-bit address signal and one of a read command and a write command;

in response to the one of the command and write command, selecting a column of the memory cell array according to m-bits of the multi-bit address signal, where n>m, where n−m=a, and where a≧1; and setting an operating mode of the memory device using at least one of a-bits of the multi-bit address signal used in selecting the column of the memory cell array, wherein the operating mode is at least one of a burst length mode, a DLL reset mode, a test mode, a CAS latency mode, and a burst type mode.

48. The method of claim 47, wherein the operating mode is a burst length mode.

49. The method of claim 47, wherein the at least one a-bits is at least one unused bit of the multi-bit address signal used in the selection of the column of the memory cell array.

50. A method for setting an operating mode of a memory device having a memory array, said method comprising:

receiving a mode setting command;

generating a first mode selection signal in response to the mode setting command;

receiving a multi-bit address signal;

decoding the multi-bit address signal to select a row of the memory array in response to a row active command;

decoding the multi-bit address signal to select a column of the memory array in response to a one of a read command and a write command;

generating outputs a second mode selection signal according to at least one bit from the multi-bit address signal used in the selection of the row or the column; and a mode control circuit which sets an operating mode of the memory device according to the one of the first and second mode selection signals.

51. The method of claim 50, wherein the operating mode is a burst length mode.

52. The method of claim 50, wherein the operating mode is at least one of a burst length mode, a DLL reset mode, a test mode, a CAS latency mode, and a burst type mode.

53. The method of claim 50, wherein the at least one bit is at least one unused bit of the multi-bit address signal used in the selection of the row or the column.

54. The method of claim 50, wherein setting an operating mode of the memory device according to the one of the first and second mode selection signals, comprises switching between the first and second mode selection signals in response to at least one control signal.

55. The method of claim 54, further including decoding commands from a plurality of input signals, and wherein the at least one control signal includes at least one decoded command from the command decoder.

56. The method of claim 55, wherein the at least one control signal includes at least one of a decoded read command a decoded write command, and a decoded MRS command.

* * * * *